United States Patent [19]

Smith et al.

[11] Patent Number: 4,525,851
[45] Date of Patent: Jun. 25, 1985

[54] FREQUENCY GENERATOR CIRCUIT

[75] Inventors: Philip S. Smith; Michael G. Gallup, both of Austin, Tex.

[73] Assignee: Motorola Inc., Schaumburg, Ill.

[21] Appl. No.: 501,314

[22] Filed: Jun. 6, 1983

[51] Int. Cl.³ .............................................. H03K 21/36
[52] U.S. Cl. .................................. 377/110; 377/111; 377/114; 377/117
[58] Field of Search ............... 377/111, 110, 114, 116, 377/117

[56] References Cited

U.S. PATENT DOCUMENTS

| | | | |
|---|---|---|---|
| 3,287,648 | 11/1966 | Poole | 377/110 |
| 3,493,872 | 2/1970 | Sepe | 377/116 |
| 3,614,632 | 10/1971 | Leibowitz | 377/110 |
| 3,657,658 | 4/1972 | Kubo | 377/110 |
| 4,296,380 | 10/1981 | Minakuchi | 377/110 |
| 4,360,742 | 11/1982 | Freyman | 377/117 |

Primary Examiner—John S. Heyman
Attorney, Agent, or Firm—Anthony J. Sarli, Jr.; Jeffrey Van Myers; Robert L. King

[57] ABSTRACT

A frequency generator circuit which provides an output signal which is both synchronous with and proportional in frequency to a clock signal of predetermined frequency in response to an input control signal is provided. A frequency divider portion couples a clock signal of divided frequencies to predetermined control electrodes of series-connected switches which selectively couple an output node to a reference voltage node. A decode portion selectively bypasses predetermined switches in response to the input control signal to selectively couple the reference node to the output node. A latch is coupled to the output node to hold the decoded output signal at a predetermined logic level for a predetermined amount of time.

9 Claims, 3 Drawing Figures 16,525,851

FREQUENCY GENERATOR CIRCUIT

TECHNICAL FIELD

This invention relates generally to frequency generator circuits and, more particularly, to circuits which provide an output signal, synchronous with and proportional to a clock signal, in response to a control signal.

BACKGROUND ART

Frequency generator circuits typically utilize a one of $2^n$ decoder, where n is an integer, which utilize static logic circuits. Commonly used one of $2^n$ decoders decode binary control signals which determine the frequency of the output signal. After the control signals are decoded, at least two groups of switching circuitry are required to provide the output signal. The static logic circuits which are used for decoding tend to unduly complicate a frequency generator circuit and increase the size of the circuit.

SUMMARY OF THE INVENTION

Accordingly, an object of the present invention is to provide an improved frequency generator circuit.

Another object of the present invention is to provide an improved frequency generator circuit which minimizes decode logic and switching circuitry and provides an output signal, the output signal being both synchronous with and proportional in frequency to a clock signal of predetermined frequency, in response to a binary control signal.

In carrying out the above and other objects, there is provided, in one form, a frequency generator circuit having a frequency divider means for receiving a clock signal of predetermined frequency. The frequency divider means have a plurality of ranked outputs, wherein each of the outputs provides a signal which is a predetermined division of the clock signal. A single group of switching means having a plurality of switches coupled in series between a reference node and an output node is provided. Each of the switches has a control electrode coupled to a predetermined output of the frequency divider means. Decode means are connected directly to a raw binary input control signal and have a plurality of outputs, each of which is connected to the single group of switching means for providing an output signal which is synchronous with the clock signal in response to the input signal. Decode circuitry is thereby simplified. The output signal has a frequency which is proportional to the clock signal. Latching means are coupled to the output signal for providing the output signal.

The above and other objects, features and advantages of the present invention will be more clearly understood from the following detailed description taken in conjunction with the accompanying drawings.

DESCRIPTION OF A PREFERRED EMBODIMENT

Figure 1:
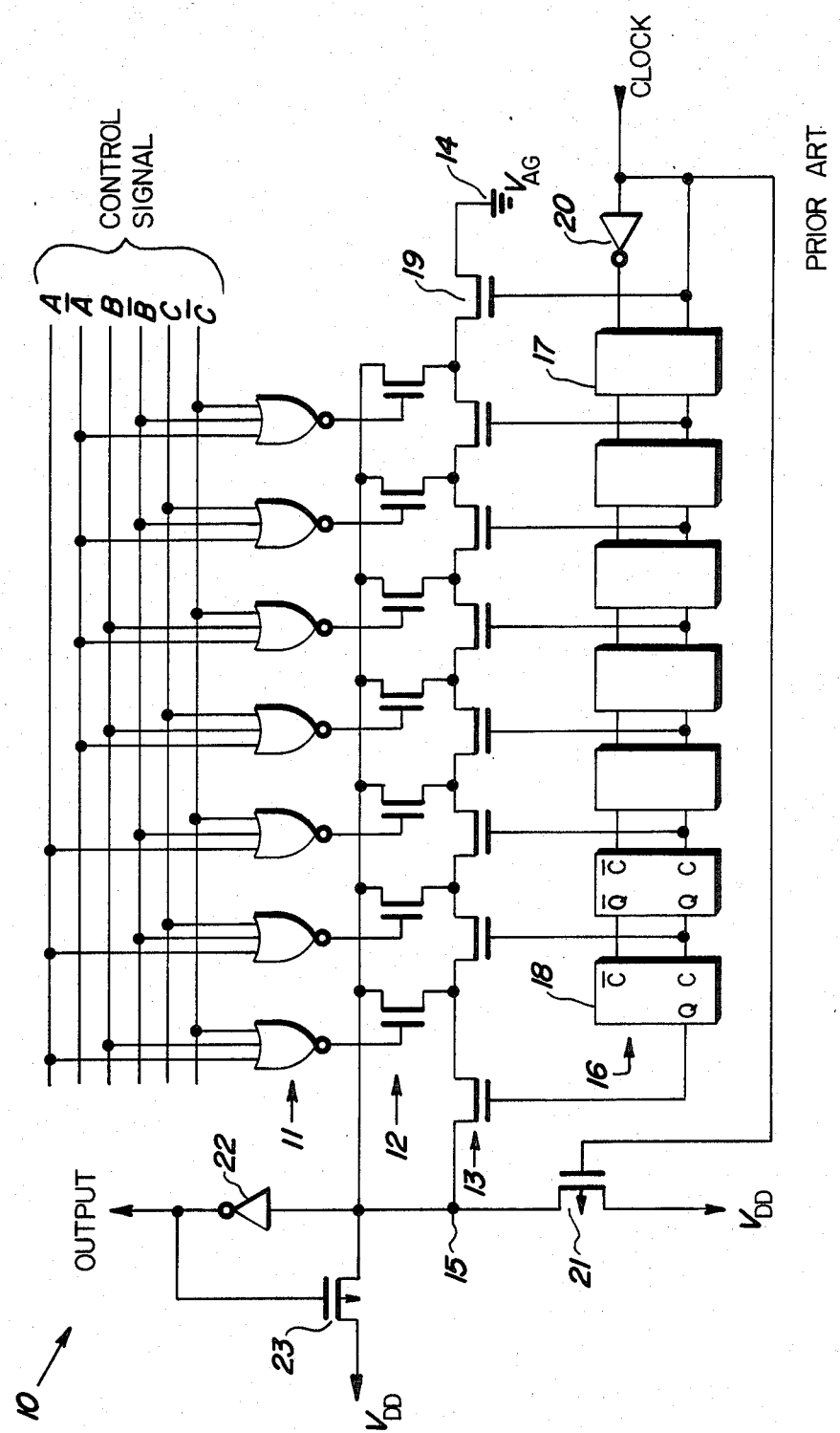
FIG. 1 illustrates in schematic form a frequency generator circuit known in the art requiring static decode logic and two groups of switches.

Shown in FIG. 1 is a known frequency generator circuit 10 having a plurality of static decode logic gates 11 with multiple inputs connected to a plurality of control inputs. In the illustrated form, the control signals are shown as a three digit binary number having eight unique states where A represents the most significant bit and C represents the least significant bit. The number of states of the control signal are numerous and are dependent in part upon a particular application. The complement of bit A is represented by $\overline{A}$. Each of the decode logic gates 11 has an output connected to a predetermined control electrode of a first plurality of switching transistors 12. A second plurality of switching transistors 13 have the current electrodes thereof connected in series to selectively couple a reference voltage node 14 to an output node 15. A plurality of rank ordered flip flops 16 are connected in series with the lowest ranked flip flop being a flip flop 17 and the highest ranked flip flop being a flip flop 18. Each of the rank ordered flip flops has an output connected to a predetermined control electrode of the second plurality of switching transistors 13. A transistor 19 of switching transistors 13 has a current electrode connected to reference node 14 and a control electrode connected to a first input of flip flop 17. A clock signal is also connected to the first input of flip flop 17 and coupled to a second input of flip flop 17 via an inverter 20. The clock signal is also connected to a control electrode of a P-channel preset transistor 21 which has a first current electrode connected to a supply voltage $V_{DD}$ and a second current electrode connected to output terminal 15. An inverter 22 has an input connected to output terminal 15, and an output for providing an output signal. A P-channel latch transistor 23 has a control electrode connected to the output of inverter 22, a first current electrode connected to output terminal 15 and a second current electrode connected to supply voltage $V_{DD}$.

In operation, frequency generator circuit 10 has control signals which are typically binary numbers coupled to the inputs of logic gates 11. Logic gates 11 decode the control signals in accordance with the type of logic gate used. The decoded control data is then connected to the control electrodes of first switching transistors 12 which switch a predetermined node formed by the second plurality of switching transistors 13 to the output node 15 in response to the decoded control signal. The portion of the second plurality of switching transistors 13 which is coupled to the right of the predetermined node couples the reference node 14 to the predetermined node at a rate determined by the rank ordered flip flops 16. Flip flops 16 function individually to divide the clock signal by a predetermined rate. Therefore, reference node 14 is coupled to output node 15 at a rate determined by the binary control signals.

In the illustrated form, all of the first and second switching transistors 12 and 13 are typically of a single process type. However, the transistors associated with each of decode logic gates 11 and flip flops 16 are commonly static and of an opposite process type requiring additional layout area to implement. Further, the presence and necessity of decode logic gates 11 and the two groups of switching transistors substantially increases the physical size of circuit 10.

Figure 2:
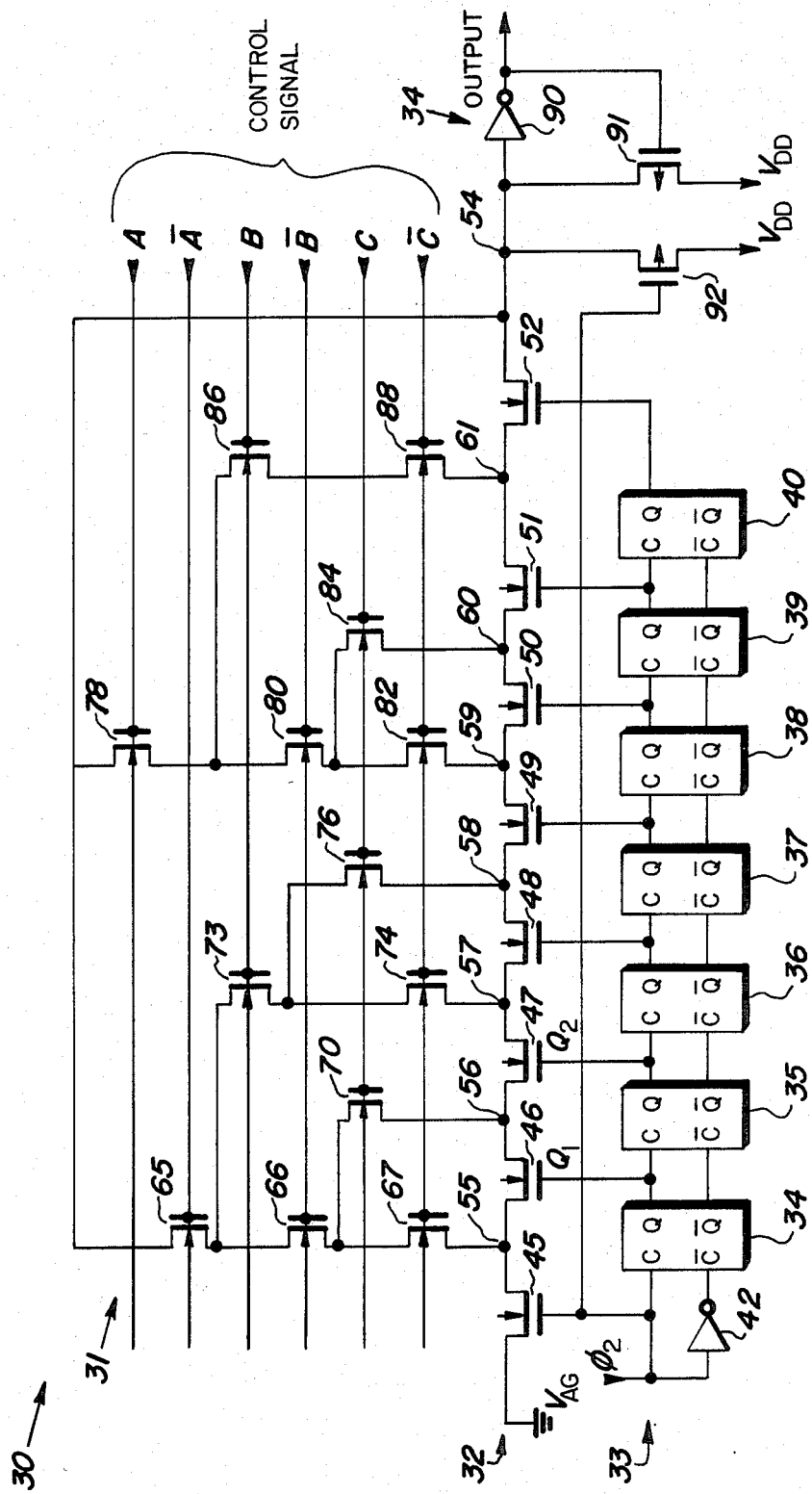
FIG. 2 illustrates in schematic form a frequency generator circuit in accordance with a preferred embodiment of the present invention.

Shown in FIG. 2 is a frequency generator circuit 30 constructed in accordance with a preferred embodiment of the present invention generally comprising a decode section 31, a switch section 32, a frequency divider section 33 and a latch section 89. Frequency divider section 33 comprises a plurality of rank ordered flip flops 34, 35, 36, 37, 38, 39 and 40, which are ranked from highest to lowest rank, respectively. Each of flip flops 34-40 has a first and a second clock input designated by C and $\overline{C}$, respectively, and a first and a second output designated by Q and $\overline{Q}$, respectively. Both a first input of a flip flop 34 of highest rank and an input of an inverter 42 are connected to a clock signal $\phi_2$. An output of inverter 42 is connected to the second input of flip flop 34. Each of flip flops 34, 35, 36, 37, 38 and 39 has a first output connected to the first input of the flip flop of next lower rank and a second output connected to the second input of the flip flop of next lower rank.

Switch section 32 comprises a rank ordered plurality of transistor switches 45, 46, 47, 48, 49, 50, 51 and 52 from highest to lowest rank, respectively, for selectively coupling a reference voltage, say $V_{AG}$, to an output node 54. Transistor 45 has a first current electrode connected to reference voltage $V_{AG}$, a control electrode connected to clock signal $\phi_2$, and a second current electrode connected to a first current electrode of transistor 46 via a node 55. Transistor 46 has a control electrode connected to the first output of flip flop 34 labeled $Q_1$, and a second current electrode connected to a first current electrode of transistor 47 via a node 56. Transistor 47 has a control electrode connected to the first output of flip flop 35 labeled $Q_2$, and a second current electrode connected to a first current electrode of transistor 48 via a node 57. Transistor 48 has a control electrode connected to the first output of flip flop 36, and a second current electrode connected to a first current electrode of transistor 49 via a node 58. Transistor 49 has a control electrode connected to the first output of flip flop 37, and a second current electrode connected to a first current electrode of transistor 50 via a node 59. Transistor 50 has a control electrode connected to the first output of flip flop 38, and a second current electrode connected to a first current electrode of transistor 51 via a node 60. Transistor 51 has a control electrode connected to the first output of flip flop 39, and a second current electrode connected to a first current electrode of transistor 52 via a node 61. Transistor 52 has a control electrode connected to the first output of flip flop 40, and a second current electrode connected to the output node 54.

Decode section 31 comprises a plurality of decode transistors for selectively coupling the output node 54 to a predetermined one of the nodes 55, 56, 57, 58, 59, 60 or 61 in response to binary input control signals A, $\overline{A}$, B, $\overline{B}$, C and $\overline{C}$, where A is the most significant bit of the control signal and C is the least significant bit of the control signal. A decode transistor 65 has a first current electrode connected to output node 54, a control electrode connected to control signal $\overline{A}$, and a second current electrode connected to a first current electrode of a decode transistor 66. Decode transistor 66 has a control electrode connected to control signal $\overline{B}$, and a second current electrode connected to a first current electrode of a decode transistor 67. Decode transistor 67 has a control electrode connected to control signal $\overline{C}$, and a second current electrode connected to node 55. A decode transistor 70 has a first current electrode connected to the second current electrode of decode transistor 66, a control electrode connected to control signal C, and a second current electrode connected to node 56.

A decode transistor 73 has a first current electrode connected to the second current electrode of decode transistor 65, a control electrode connected to control signal B, and a second current electrode connected to a first current electrode of a decode transistor 74. A control electrode of transistor 74 is connected to control signal $\overline{C}$, and a second current electrode of transistor 74 is connected to node 57. A decode transistor 76 has a first current electrode connected to the second current electrode of decode transistor 73, a control electrode connected to control signal C, and a second current electrode connected to node 58. A decode transistor 78 has a first current electrode connected to output node 54, a control electrode connected to control signal A, and a second current electrode connected to a first current electrode of a decode transistor 80. A control electrode of decode transistor 80 is connected to control signal $\overline{B}$, and a second current electrode of transistor 80 is connected to a first current electrode of a decode transistor 82. A control electrode of decode transistor 82 is connected to control signal $\overline{C}$, and a second current electrode of decode transistor 82 is connected to node 59. A first current electrode of a decode transistor 84 is connected to a second current electrode of decode transistor 80. Decode transistor 84 has a control electrode connected to control signal C, and a second current electrode connected to node 60. A decode transistor 86 has a first current electrode connected to the second current electrode of transistor 78, a control electrode connected to control signal B, and a second current electrode connected to a first current electrode of a decode transistor 88. A control electrode of decode transistor 88 is connected to control signal $\overline{C}$, and a second current electrode of decode transistor 88 is connected to output node 61.

Latch section 89 comprises an inverter buffer amplifier 90 having an input connected to output node 54 and an output for providing an output decode signal. A latch transistor 91 has a first current electrode connected to output terminal 54, a control electrode connected to the decode output signal, and a second current electrode connected to supply voltage $V_{DD}$. A preset transistor 92 has a first current electrode connected to output terminal 54, a control electrode connected to clock $\phi_2$, and a second current electrode connected to supply voltage $V_{DD}$. In a preferred form, transistors 91 and 92 are P-channel MOS transistors and all other illustrated transistors are N-channel MOS transistors. Although specific N-channel and P-channel MOS devices are shown, it should be apparent that decoder circuit 30 may be implemented by completely reversing the processing techniques (e.g. P-channel to N-channel) or by using other types of transistors.

Figure 3:
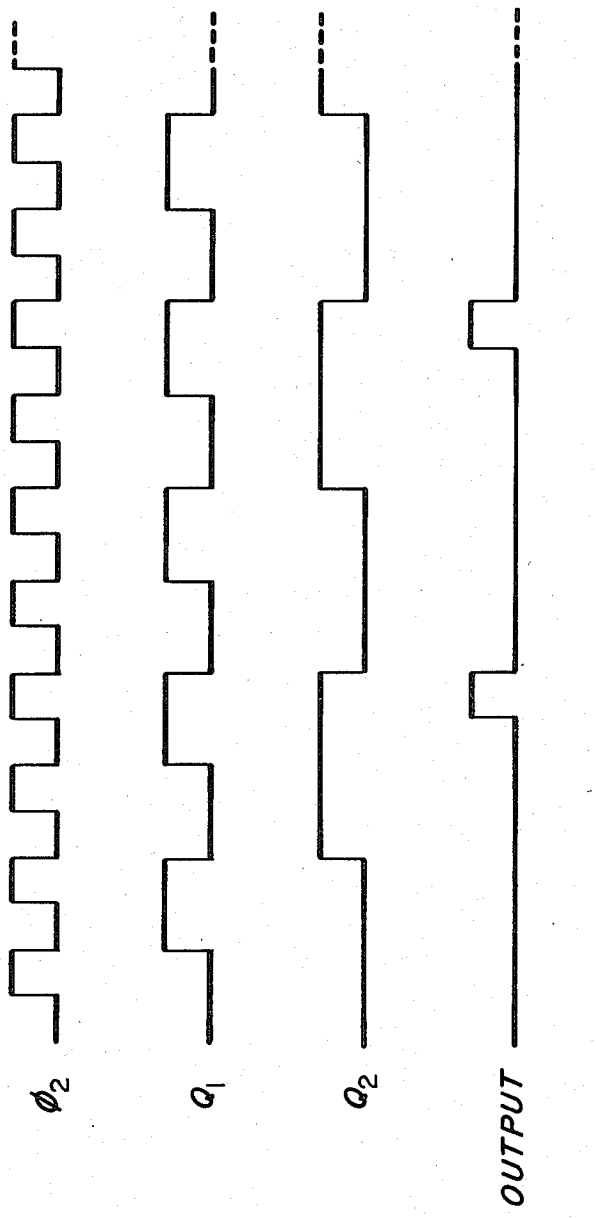
FIG. 3 illustrates in graphical form waveforms associated with the frequency generator circuit of FIG. 2.

In operation, clock signal $\phi_2$ of predetermined frequency illustrated in FIG. 3 is coupled to the first and second inputs of flip flop 34 of frequency divider section 33. Clock signal $\phi_2$ is divided a predetermined amount by each flip flop of frequency divider section 33. For example, the outputs $Q_1$ and $Q_2$ of flip flops 34 and 35, respectively, are illustrated in FIG. 3 where signal $Q_2$ is substantially one-half the frequency of signal $Q_1$. In a preferred form, flip flops 36, 37, 38, 39 and 40 each continue to divide signal $\phi_2$ by substantially one-half. In this way, node 56 is coupled to the $V_{AG}$ reference node twice as long as node 57 is. Therefore, output node 54 is coupled to the $V_{AG}$ reference node via switch section 32 once every $2^m$ positive leading edges of clock signal $\phi_2$, where m is the number of rank ordered flip flops.

Shown in FIG. 3 is an illustration of the frequency generator output waveform resulting from a binary input control signal of 011001 which is connected directly to decode section 31 in the order of A $\bar{A}$ B $\bar{B}$ C $\bar{C}$, respectively. The binary input control signal makes decode transistors 65, 73 and 74 conductive and all other decode transistors of decode section 31 nonconductive thereby coupling output node 54 to node 57. In other words, transistor switches 48, 49, 50, 51 and 52 have been selectively short-circuited so that transistor switches 45, 46 and 47 are the only operative switches between output node 54 and the reference voltage $V_{AG}$ node. Since signal $Q_2$ has a frequency which is substantially one-fourth the frequency of signal $\phi_2$, the decoded output signal shown in FIG. 3 is substantially one-fourth the frequency of clock signal $\phi_2$. Preset transistor 92 couples reference voltage $V_{DD}$ to latch section 89 synchronously with clock signal $\phi_2$ during a low logic level of the clock signal since transistor 92 is a P-channel transistor. Preset transistor 92 sets a low logic level at the output of inverter 90 during an inactive period of the frequency generator output. During an active period when the frequency generator output signal is at a determined level, inverter 90 and latch transistor 91 provides the frequency generator output signal until clock signal $\phi_2$ causes preset transistor 92 to preset the frequency generator output to a low logic level again. Transistor 91 should be made with small control electrode dimensions in comparison with transistors 45 and 92 to allow transistors 45 and 92 to control the output.

Decode section 31 is a tree decoder which provides multiple "tree" paths from output node 54 to a predetermined one of nodes 55–61. After the binary control bits select a path thru the tree decoder, inverter 90 of latch section 89 is flipped when a predetermined number of $\phi_2$ clock pulses have occurred. Upon the following half cycle of clock signal $\phi_2$, preset transistor 92 controls the output to provide a low logic level output. At this point, the circuit operation continues in a repetitive manner between active and inactive periods. In a preferred form, signal $\phi_2$ has a frequency which is used to derive a baud rate output clock signal. However, signal $\phi_2$ may be of any frequency and of any shape sufficient to operate in conjunction with latch section 89.

By now it should be apparent that a frequency generator circuit having simple decode logic and only one group of switching transistors has been provided. The present invention is simple in that a tree decoder having transistors with control electrodes directly connected to a raw binary number is utilized. This provides a direct correlation between the binary value of the control signal and the resultant decoded output signal. Further, only a single group of switches which are directly connected to the tree decoder is provided.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

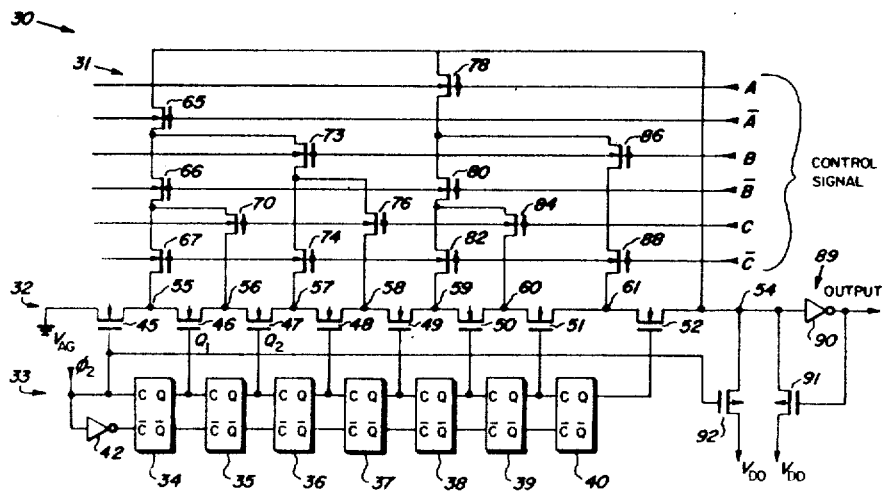

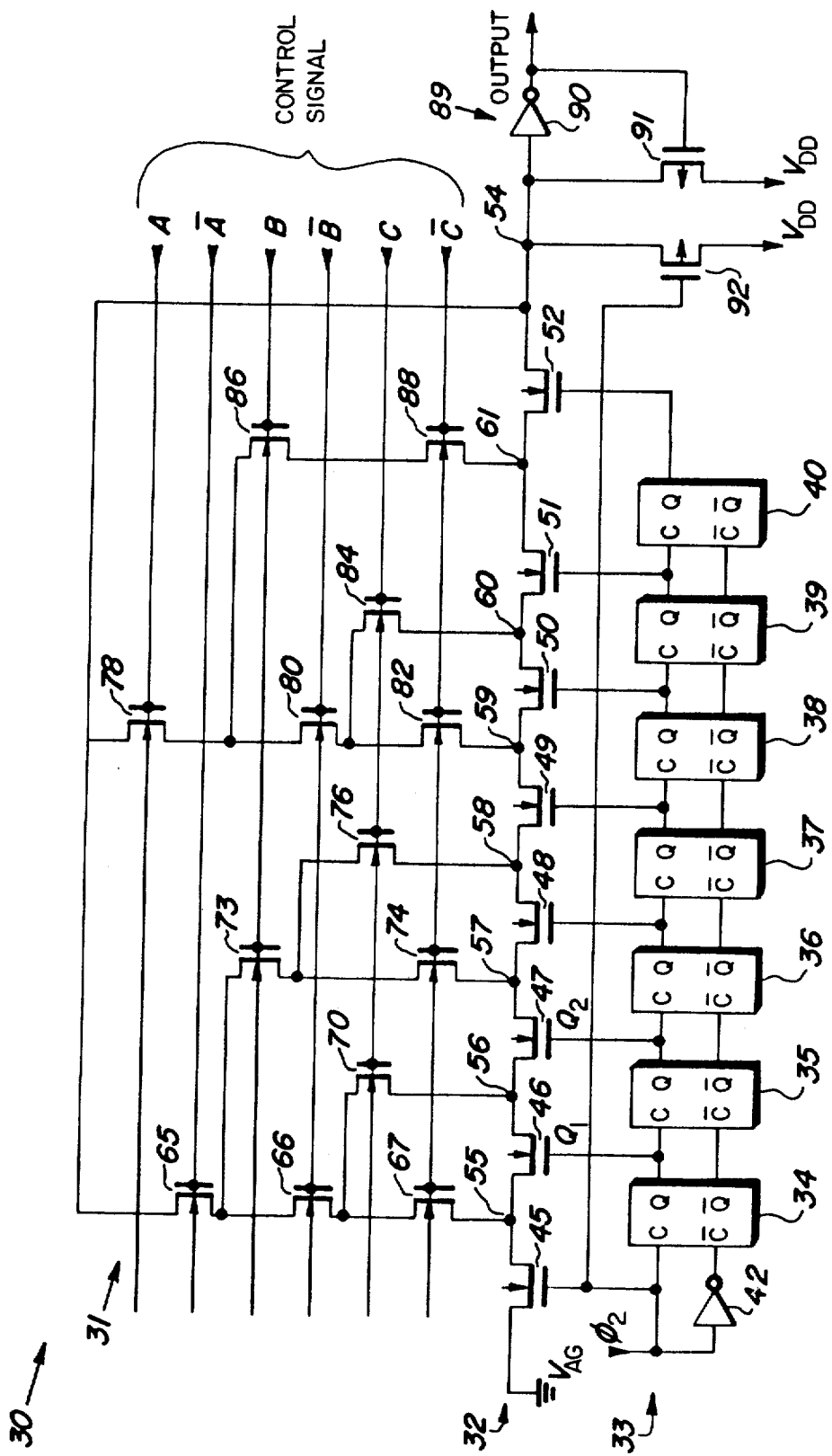

We claim:

1. A frequency generator circuit for providing an output signal which is synchronous with a clock signal of predetermined frequency and which has a frequency which is proportional to the frequency of the clock signal, comprising:

frequency divider means having an input for receiving the clock signal, and a plurality of ranked outputs, each of said outputs providing a divided signal having a frequency proportional to the predetermined frequency;

a plurality of switching means connected in series between a reference node and an output node, and forming a plurality of rank ordered nodes, the first of said switching means having a control electrode connected to the input of the frequency divider means and each of the remaining switching means having a control electrode connected directly to a predetermined one of said ranked outputs of the frequency divider means;

decode means connected directly to each of the rank ordered nodes for selectively coupling the output node to a predetermined one of the rank ordered nodes in response to a binary input control signal, comprising:

at least one node select transistor coupled between each rank ordered node and the output node, each of the node select transistors having a control electrode connected directly to the control signal; and latching means having an input connected to the output node, and an output for latching the output node at a predetermined logic level during an inactive period and otherwise providing the synchronous output signal.

2. The frequency generator circuit of claim 1 wherein the frequency divider means comprise:

a plurality of rank ordered flip flop circuits coupled in series wherein an input of the first flip flop receives the clock signal, and an output of each flip flop provides a predetermined one of the divided signals.

3. The frequency generator circuit of claim 1 wherein each of the series coupled switching means comprise a transistor, a first of which has a current electrode coupled to the reference node, the last of which has a current electrode coupled to the output node.

4. A frequency generator circuit for providing an output signal which is synchronous with a clock signal of predetermined frequency and which has a frequency which is proportional to the frequency of the clock signal, comprising:

frequency divider means having an input for receiving the clock signal, and a plurality of ranked outputs, each of said outputs providing a divided signal having a frequency proportional to the predetermined frequency;

a plurality of switching means connected in series between a reference node and an output node, and forming a plurality of rank ordered nodes, the first of said switching means having a control electrode connected to the input of the frequency divider means and each of the remaining switching means having a control electrode connected directly to a predetermined one of said ranked outputs of the frequency divider means;

first, second and third node select transistors coupled in series between the output node and a first rank ordered node;

a fourth node select transistor connected in series with the first and second node select transistors between the output node and a second rank ordered node;
fifth and sixth node select transistors connected in series with the first node select transistor between the output node and a third rank ordered node;
a seventh node select transistor connected in series with the fifth and first node select transistors between the output node and a fourth rank ordered node;
eighth, ninth and tenth node select transistors connected in series between the output node and a fifth rank ordered node;
an eleventh node select transistor connected in series with the eighth and ninth node select transistors between the output node and a sixth rank ordered node;
twelfth and thirteenth node select transistors connected in series between the output node and a seventh rank ordered node, each of said node select transistors having a control electrode connected directly to the control signal; and
latching means having an input connected to the output node, and an output for latching the output node at a predetermined logic level during an inactive period and otherwise providing the synchronous output signal.

5. The frequency generator circuit of claim 1 wherein the latching means comprise:
a preset transistor having a first current electrode coupled to the output node, a control electrode coupled to the clock signal, and a second current electrode coupled to a supply voltage;
a latch transistor having a first current electrode coupled to the output node, a second current electrode coupled to the supply voltage, and a control electrode; and
an inverter having an input coupled to the first current electrode of the latch transistor, and an output coupled to the control electrode of the latch transistor, for providing the output signal.

6. A method of providing an output signal in response to a control signal, the output signal being synchronous with a clock signal, comprising the steps of:
dividing the clock signal into a plurality of divided signals, each divided signal having a frequency proportional to the clock signal and providing each divided signal at a predetermined one of a plurality of rank ordered nodes;
providing a tree decoder to couple a predetermined one of the rank ordered nodes to an output terminal in response to the control signal; and providing the predetermined divided signal as the output signal for a predetermined amount of time.

7. The method of claim 6 wherein each of the divided signals are coupled to the output terminal via decode transistors coupled in a predetermined path corresponding to a predetermined divided signal, each of the decode transistors having a control electrode directly connected to a predetermined bit of the control signal.

8. A frequency generator circuit for providing an output signal in response to a binary input control signal, the output signal being synchronous with a clock signal, comprising:
a plurality of rank ordered flip flop circuits coupled in series wherein an input of the first flip flop receives the clock signal, and an output of each flip flop provides a predetermined one of a plurality of divided signals;
a plurality of transistor switches coupled in series between a reference node and an output node and forming a plurality of rank ordered nodes, the first of the transistor switches having a control electrode coupled to the input of the first flip flop and each of the remaining transistor switches having a control electrode coupled to a predetermined one of the divided signals;
decode means coupled to each of the transistor switches for coupling the output node to a predetermined one of the rank ordered nodes in response to the binary input control signal, comprising:
at least one node select transistor coupled between each rank ordered node and the output node, each of the node select transistors having a control electrode connected directly to the binary input control signal; and
a latch circuit having an input coupled to the output node, and an output for latching the output at a predetermined logic level during an inactive period and otherwise providing the synchronous output signal.

9. A frequency generator circuit for providing an output signal in response to a binary input control signal, the output signal being synchronous with a clock signal, comprising:
a plurality of rank ordered flip flop circuits coupled in series wherein an input of the first flip flop receives the clock signal, and an output of each flip flop provides a predetermined one of a plurality of divided signals;
a plurality of transistor switches coupled in series between a reference node and an output node and forming a plurality of rank ordered nodes, the first of the transistor switches having a control electrode coupled to the input of the first flip flop and each of the remaining transistor switches having a control electrode coupled to a predetermined one of the divided signals;
first, second and third node select transistors coupled in series between the output node and a first rank ordered node;
a fourth node select transistor connected in series with the first and second node select transistors between the output node and a second rank ordered node;
fifth and sixth node select transistors connected in series with the first node select transistor between the output node and a third rank ordered node;
a seventh node select transistor connected in series with the fifth and first node select transistors between the output node and a fourth rank ordered node;
eighth, ninth and tenth node select transistors connected in series between the output node and a fifth rank ordered node;
an eleventh node select transistor connected in series with the eighth and ninth node select transistors between the output node and a sixth rank ordered node;
twelfth and thirteenth node select transistors connected in series between the output node and a seventh rank ordered node, each of the node select transistors having a control electrode coupled to the binary input control signal; and
a latch circuit having an input coupled to the output node, and an output for latching the output at a predetermined logic level during an inactive period and otherwise providing the synchronous output signal.

* * * * *

UNITED STATES PATENT AND TRADEMARK OFFICE
CERTIFICATE OF CORRECTION

PATENT NO. : 4,525,851            Page 1 of 3

DATED : June 25, 1985

INVENTOR(S) : Philip S. Smith et al

It is certified that error appears in the above-identified patent and that said Letters Patent is hereby corrected as shown below:

The title page showing the illustrative figure should be deleted to appear as shown on the attached sheet.

Figure 2 should appear as shown on the attached sheet.

Signed and Sealed this

First Day of October 1985

[SEAL]

*Attest:*

*Attesting Officer*

DONALD J. QUIGG

*Commissioner of Patents and Trademarks—Designate*

United States Patent [19]

Smith et al.

[11] Patent Number: 4,525,851
[45] Date of Patent: Jun. 25, 1985

[54] FREQUENCY GENERATOR CIRCUIT

[75] Inventors: Philip S. Smith; Michael G. Gallup, both of Austin, Tex.

[73] Assignee: Motorola Inc., Schaumburg, Ill.

[21] Appl. No.: 501,314

[22] Filed: Jun. 6, 1983

[51] Int. Cl.³ .......................................... H03K 21/36
[52] U.S. Cl. ................................. 377/110; 377/111; 377/114; 377/117
[58] Field of Search ............... 377/111, 110, 114, 116, 377/117

[56] References Cited

U.S. PATENT DOCUMENTS

| | | | |
|---|---|---|---|
| 3,287,648 | 11/1966 | Poole | 377/110 |
| 3,493,872 | 2/1970 | Sepe | 377/116 |
| 3,614,632 | 10/1971 | Leibowitz | 377/110 |
| 3,657,658 | 4/1972 | Kubo | 377/110 |
| 4,296,380 | 10/1981 | Minakuchi | 377/110 |
| 4,360,742 | 11/1982 | Freyman | 377/117 |

Primary Examiner—John S. Heyman
Attorney, Agent, or Firm—Anthony J. Sarli, Jr.; Jeffrey Van Myers; Robert L. King

[57] ABSTRACT

A frequency generator circuit which provides an output signal which is both synchronous with and proportional in frequency to a clock signal of predetermined frequency in response to an input control signal is provided. A frequency divider portion couples a clock signal of divided frequencies to predetermined control electrodes of series-connected switches which selectively couple an output node to a reference voltage node. A decode portion selectively bypasses predetermined switches in response to the input control signal to selectively couple the reference node to the output node. A latch is coupled to the output node to hold the decoded output signal at a predetermined logic level for a predetermined amount of time.

9 Claims, 3 Drawing Figures